US007573741B2

(12) United States Patent  (10) Patent No.: US 7,573,741 B2
Jakobs et al.  (45) Date of Patent: Aug. 11, 2009

(54) METHOD AND CIRCUIT ARRANGEMENTS FOR ADJUSTING SIGNAL PROPAGATION TIMES IN A MEMORY SYSTEM

(75) Inventors: Andreas Jakobs, München (DE); Eckehard Plaettner, Oberhaching (DE)

(73) Assignee: Infineon Technologies AG, Munich (DE)

( * ) Notice: Subject to any disclaimer, the term of this patent is extended or adjusted under 35 U.S.C. 154(b) by 870 days.

(21) Appl. No.: 11/236,970

(22) Filed: Sep. 28, 2005

(65) Prior Publication Data
US 2006/0109869 A1 May 25, 2006

(30) Foreign Application Priority Data
Sep. 28, 2004 (DE) .................... 10 2004 046 957

(51) Int. Cl.
*G11C 11/34* (2006.01)
(52) U.S. Cl. .............................. 365/185.05; 365/185.17; 365/194; 365/233.1
(58) Field of Classification Search ............ 365/185.05, 365/185.17, 194, 233.1
See application file for complete search history.

(56) References Cited

U.S. PATENT DOCUMENTS

| | | | |
|---|---|---|---|
| 5,646,904 | A | 7/1997 | Ohno et al. |
| 6,134,182 | A | 10/2000 | Pilo et al. |
| 6,990,027 | B2 * | 1/2006 | Jang .......................... 365/201 |
| 2002/0178318 | A1 | 11/2002 | Muff |
| 2003/0200407 | A1 | 10/2003 | Osaka et al. |
| 2004/0080322 | A1 | 4/2004 | Braun et al. |

FOREIGN PATENT DOCUMENTS

| | | |
|---|---|---|
| JP | 7073118 | 3/1995 |
| JP | 10224204 | 8/1998 |
| JP | 2001243773 | 9/2001 |
| WO | WO 0116767 | 3/2001 |

\* cited by examiner

*Primary Examiner*—Son Dinh
*Assistant Examiner*—Nam Nguyen
(74) *Attorney, Agent, or Firm*—Patterson & Sheridan, L.L.P.

(57) ABSTRACT

The invention describes a method for adjusting signal propagation times in a memory system in which a controller is connected to at least one memory chip via a plurality of connecting lines for the purpose of transmitting control and data signals and at least one time reference signal. In line with the invention, the propagation time differences between connecting lines are ascertained from the result of echo measurements. To this end a respective transmitted pulse is applied to one end, selected as the transmission end, of the connecting lines in question, while the other end of the connecting lines in question is respectively terminated with a reflective termination. At the transmission end, the echo time which elapses between one edge of the transmitted pulse and the appearance of this edge's echo reflected from the other end is measured. On the basis of the ascertained propagation time differences, regulatable delay devices are set in order to compensate for these propagation time differences. The subject matter of the invention is also circuit arrangements for performing this method.

20 Claims, 4 Drawing Sheets

METHOD AND CIRCUIT ARRANGEMENTS FOR ADJUSTING SIGNAL PROPAGATION TIMES IN A MEMORY SYSTEM

CROSS-REFERENCE TO RELATED APPLICATIONS

This application claims foreign priority benefits under 35 U.S.C. §119 to co-pending German patent application number DE 10 2004 046 957.1-55, filed 28 Sep. 2004. This related patent application is herein incorporated by reference in its entirety.

BACKGROUND OF THE INVENTION

1. Field of the Invention

The invention relates to a method for adjusting signal propagation time in a memory system in which a controller is connected to at least one memory chip via a plurality of connecting lines. The subject matter of the invention also relates to circuit arrangements for performing this method. A preferred, but not exclusive, field of application is memory systems with RAM (Random Access Memory) chips, particularly with synchronous dynamic RAMs (SDRAMS). The subject matter of the invention also relates to circuit arrangements in controllers of memory chips for performing the adjustment method.

2. Description of the Related Art

The communication between one or more memory chips and a common controller in a memory system takes place under clock control. Both the memory data and the control signals, which are to be transmitted, are transferred to the connecting lines at the respective transmission end as bits (binary samples). At the respective reception end, the data and control signals received via the connecting lines are sampled using suitably positioned clock edges. These clock edges must each come in the validity time of the bits, i.e. they must each appear within that period of time in which the level of the signal to be sampled explicitly represents the logic value of the transmitted bit.

In order to synchronize the signal transmission, it is necessary to transmit, together with the data and control signals, at least one time reference signal from which it is possible to derive the clock edges for correct-time sampling of the received bits at the reception end. Normally, each memory chip has two separate transmission lines for time reference signals connected to it, a clock signal line for transmitting a clock signal from the controller to the memory chip and a strobe signal line for transmitting a data strobe signal between the controller and the memory chip. The clock signal is used in the memory chip as a time reference for the storage operations and is also used as a time reference for sampling the control signals, which include both binary-coded instruction signals for initiating the various storage operations and the binary-coded address signals for selectively addressing the memory cells within the memory chip. The data strobe signal is generated in the write mode in the controller and, together with the write data, is transmitted to the memory chip and forms the time reference for sampling the write data. In the read mode, the data strobe signal is generated in the memory chip and, together with the read data, is transmitted to the controller and forms the time reference for sampling the read data.

It is an object of the system designer to ensure that the phase relationships between the various signals are respectively kept within firmly prescribed tolerance limits both at the transmission end and at the reception end. Observing the phase relationships at the reception end is a problem particularly when various signals are transmitted via connecting lines having different signal propagation times. Propagation time differences along the connecting lines may arise if the lines are of different lengths. For this reason, great care has been taken to date to make the connecting lines of the same length as far as possible and to minimize propagation time differences as a result.

This solution is unsatisfactory, however. First, layout problems may arise when the line lengths are given the same proportions, particularly if a controller communicates with a plurality of memory chips which are at different physical distances from the controller. Secondly, besides the geometric length, there are also other factors which affect the propagation speed of the signals along the lines and hence the propagation time, e.g. the width of the conductor tracks, their geometric relationship to the conductors of the respective reference potentials (ground or supply potential) and also their surroundings if stray fields reach said surroundings.

The aforementioned propagation time differences could be compensated for at the transmission or reception end by suitable delay devices. Generally, controllers and memory chips are produced as separate units, normally as integrated and ready-encapsulated circuits (chips), so that they can be combined arbitrarily to form a memory system of desired size and configuration. For this reason, it is almost impossible to predict all of the features of the connecting lines used in the combined memory system which determine propagation time. To set the delay devices appropriately, it would be possible to measure the phases of the signals received via various connecting lines relative to a respective reference phase, e.g. relative to the phase of the received clock signal, on the memory chip. This would require a respective phase comparator to be provided in the memory chip for each signal which is to be measured. However, it is almost impossible to measure large propagation time differences explicitly according to magnitude and arithmetic sign using pure phase comparison, particularly if these differences are more than one clock period. Problems may thus arise with progressive development, which aims at ever higher clock frequencies.

US 2003/0200407 A1 discloses a method and a circuit arrangement for adjusting propagation time differences in a memory system in which connections of a controller are connected to connections of a memory chip via a plurality of connecting lines, where in addition to the connecting lines there are dummy connecting lines between the controller and the memory chip which have a reflective termination at the memory chip end and are connected to an evaluation unit at the controller end. These dummy signal lines, whose length corresponds to that of the regular data and signal connecting lines, can then be used to form echo measurements and the ascertained propagation time differences can then be compensated for using delay devices.

SUMMARY OF THE INVENTION

One aspect of the invention provides a technique for adjusting the propagation time differences in a memory system which allows quantitative inclusion of propagation time differences of any magnitude.

Accordingly, the invention is implemented as a method for adjusting signal propagation times in a memory system in which a controller is connected to at least one memory chip via a plurality of connecting lines for the purpose of transmitting control and data signals and at least one time reference signal. In line with the invention, the propagation time differences between connecting lines are ascertained from the result of echo measurements. To this end, a respective transmitted pulse is applied to one end, selected as transmission end, of the connecting lines in question, while the other end of the connecting lines in question is terminated with a respective reflective termination. At the transmission end, the echo time which elapses between one edge of the transmitted pulse and the appearance of this edge's echo reflected from the other end is measured. Depending on the ascertained propagation time differences, regulatable delay devices are set in order to compensate for these propagation time differences.

One advantage of the invention is that the propagation time differences for which compensation is required are not measured as phase differences, but rather as absolute time values. It is thus possible to measure and compensate for propagation time differences of any magnitude. Careful coordination of the geometric length of the connecting lines can thus be dispensed with. This simplifies the layout of the lines on the board on which the parts of the memory system are mounted.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
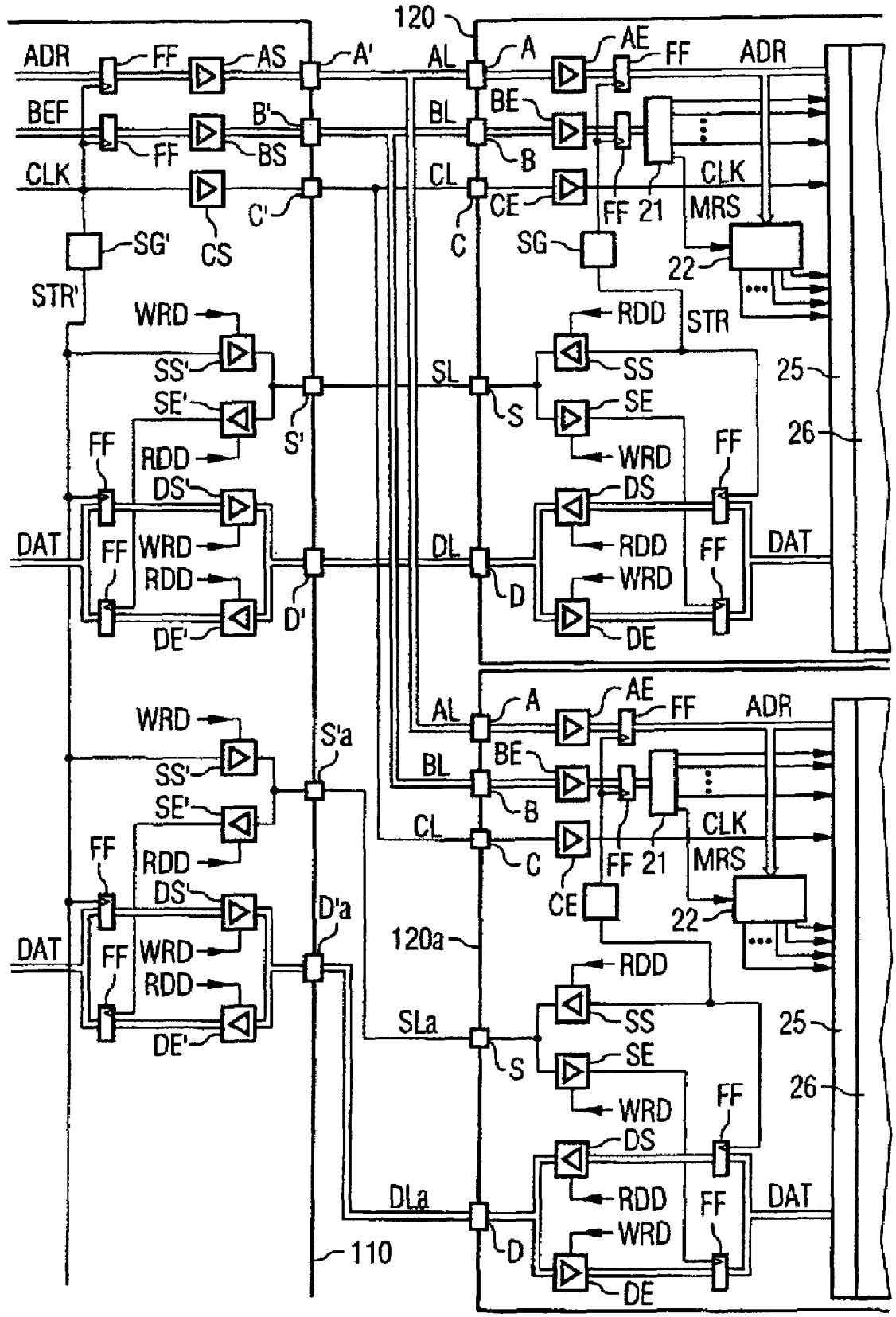
FIG. 1 shows a schematic illustration of a known memory system which can be extended in order to perform the inventive method.

The left-hand side of FIG. 1 shows component parts of a controller chip 110, and to the right of that are component parts of a first memory chip 120, in the example shown and SDRAM. The two chips 110 and 120, implemented as integrated circuits on separate chips, are designed for reciprocal communication via transmission lines. To this end, the SDRAM 120 shown in FIG. 1 has a plurality of signal connections.

A bidirectional data connection D on the SDRAM 120 contains n data pins (not shown separately) for receiving and transmitting data bits (DAT) as n-bit parallel words via a bundle of n parallel data lines DL from and to a data connection D' of the same type on the controller 110. In the SDRAM 120, each of the data pins is connected to a data reception amplifier DE and to a data transmission amplifier DS, respectively. In the controller 110, each data pin is likewise connected to a data reception amplifier DE' and to a data transmission amplifier DS', respectively.

A bidirectional strobe connection S on the SDRAM 120 is used for receiving and transmitting a strobe signal indicating the data clock from and to a strobe connection S' of the same type on the controller 110 via a strobe line SL. In the SDRAM 120 the strobe connection S is connected to a strobe reception amplifier SE and to a strobe transmission amplifier SS, and in the controller 110 the strobe connection S' is likewise connected to a strobe reception amplifier SE' and to a strobe transmission amplifier SS'.

An address connection A on the SDRAM 120 contains a plurality of address pins for receiving an address information item ADR, comprising a plurality of parallel bits, via a bundle of address lines AL from an address output A' of the controller 110. In the SDRAM 120, each address pin is connected to a respective reception amplifier AE, and in the controller 110 each address pin is connected to a respective transmission amplifier AS'.

An instruction connection B on the SDRAM 120 contains a plurality of instruction pins for receiving multibit instruction words BEF via a bundle of instruction lines BL from an instruction output B' of the controller 110. In the SDRAM 120, each instruction pin is connected to a respective reception amplifier BE, and in the controller 110 each instruction pin is connected to a respective transmission amplifier BS'.

All of the aforementioned transmission and reception amplifiers have supply connections for applying the potentials H and L of a supply voltage. The supply potential L ("low potential") may be the common ground potential, and the supply potential H ("high potential") may, by contrast, be positive or negative, depending on the semiconductor technology used. In most cases, H is positive with respect to L. The connecting conductors between the chips 110, 120 for the supply potentials are not shown in FIG. 1.

At all the connections at least on the SDRAM 120 at which signals are received, there is usually a resistor network (not shown in FIG. 1) which is proportioned such that reflection-free termination of the connecting line in question is obtained. This network usually involves the connection in question being connected to the two supply potentials H and L via a respective resistor $R=2Z_0$, where $Z_0$ is the characteristic of impedance of the connecting line in question. At the bidirectional connections, the resistor network may be connected to switching devices so as to decouple it whenever signals are transmitted at the connection in question.

To synchronize the data bits DAT, address bits ADR and instruction bits BEF, all of these bits are sampled both at the respective transmission end and at the respective reception end. For this purpose, a respective sampling circuit, e.g. in the form of a data flip-flop FF, which is clocked by an associated sampling signal is provided upstream of each of the transmission amplifiers DS', DS, AS and BS and downstream of each reception amplifier, DE', DE, AE and BE.

The necessary sampling signals are derived from a clock signal CLK which is generated in the controller 110 and samples the address bits ADR and the instruction bits BEF there. The clock signal CLK is also applied via a transmission amplifier CS to a clock connection C', where it is transmitted to a clock connection C of the SDRAM 120 via a clock line CL. In the SDRAM 120, the clock signal CLK is received via reception amplifier CE and is used to sample the received address bits and instruction bits there. The strobe signal STR' for sampling the data bits transmitted to SDRAM 120 by the controller 110 is generated in the controller by a strobe generator which generates a sampling edge in the center of each bit period of the data bits under synchronization by the clock signal CLK. This strobe signal STR' is also transmitted via the transmission amplifier SS' and the strobe line SL to the SDRAM 120, where, following amplification in the reception amplifier SE, it is used to sample the data bits received there. The strobe signal STR for sampling the data bits transmitted to the controller 110 by the SDRAM 120 is generated in the SDRAM by a strobe generator which generates a sampling edge in the center of each bit period of the data bits under synchronization by the clock signal CLK. This strobe signal STR is also transmitted via the transmission amplifier SS and the strobe line to the controller 110, where, following amplification in the reception amplifier SE', it is used to sample the data bits received there.

The repetition rate of the sampling edges of the strobe signals STR' and STR may be the same as the frequency of the clock signal CLK (for a single data rate mode), or it may be twice as high (for a double data rate mode).

An instruction decoder 21 contained in the SDRAM 120 decodes the instruction bits in order to prompt individual control lines to execute the respective instructions, inter alia, to execute the activation instruction for initiating access to the memory cells in the SDRAM, control lines for executing the write instruction and the read instruction and a control line for executing an instruction MRS ("mode register set"). The instruction MRS opens a mode register 22 for receiving information for setting particular operating parameters for the SDRAM 120. This "mode information" is delivered by the controller 110 via the address lines AL, at the same time as the instruction MRS.

The memory cells in the SDRAM 120 are shown schematically in FIG. 1 as block 26, similar to the control device 25 for the read and write access to the memory cells. The access control device 25 receives the clock signal CLK and the signals from the output-end control lines of the instruction decoder 21; it contains address decoders and a switchable network of data paths for the purpose of controlling the reading and writing of data on the memory cells, as is general knowledge.

In write mode, data bits DAT and the strobe signal STR' are transmitted to the SDRAM 120 via the controller 110 via the data lines DL and the strobe line SL. To this end, a write mode signal WRD ("write data") is switched to the active level, as a result of which the transmission amplifiers DS' and SS' in the controller 110 and the reception amplifiers DE and SE in the SDRAM 120 are turned on. In read mode, data bits DAT and the strobe signal STR are transmitted to the controller 110 via the SDRAM 120 via the data lines DL and the strobe line SL. To this end, a read mode signal RDD ("read data") is switched to the active level, as a result of which the transmission amplifiers DS and SS in the SDRAM 120 and the reception amplifiers DE' and SE' in the controller 110 are turned on.

When the controller needs to communicate with a plurality of SDRAMs simultaneously, the controller has a separate group of data and strobe connections for each SDRAM. FIG. 1 shows the connections D'a and S'a in question for communication with a second SDRAM 120a, which is designed in exactly the same way as the SDRAM 120 which has been described. Said connections D'a and S'a are respectively connected to dedicated transmission and reception amplifiers and sampling circuits within the controller 110, in the same way as the connections D' and S' for communication with the first SDRAM 120. For the transmitted signals at the connections D'a and S'a, however, the same strobe signal STR' is used as for the transmitted signals at the connections D' and S'. The address, instruction and clock connections A', B' and C' of the controller 110 are connected in parallel to the two SDRAMs 120 and 120a, as shown in FIG. 1 by branch points to the address, instruction and clock lines AL, BL and CL.

The hitherto described details of the controller/SDRAM arrangement are general knowledge. Since the instruction and address processing in the SDRAM and also the processes when reading and writing the data on the memory cells are controlled via the clock signal CLK, the most fixed phase relationship possible between all signals is important both in the controller chip and in the SDRAM chip. To observe this phase relationship, it is necessary to ensure that the signals transmitted between the chips from the respective transmission amplifier in one chip to the associated reception amplifier in the other chip all have the same propagation time. As already mentioned above, this is achieved in line with the invention by an adjustment method in which delay means in the signal paths are set in appropriate fashion, specifically on the basis of echo measurements on the connecting lines.

The connecting lines between a controller and one or more memory chips are frequently routed such that a respective plurality of lines are combined into one phase. The individual phases often take paths of different length and/or are designed in various ways, so that there are considerable propagation time differences between different phases. Within the same respective phase, the propagation times via the lines may be essentially the same or may differ to a negligible extent, however. In practice, it is usually the case that the clock line CL is laid together with the address lines AL and the instruction lines BL in a first phase, while the strobe line SL is laid together with the data lines DL in a second phase.

Assuming that propagation time differences within each phase are negligible, it suffices to measure the propagation time only on one respective line in each phase. The ascertained difference may then be used to set the delay devices on all of the lines in the same phase to the same delay value at the same time.

Figure 2:
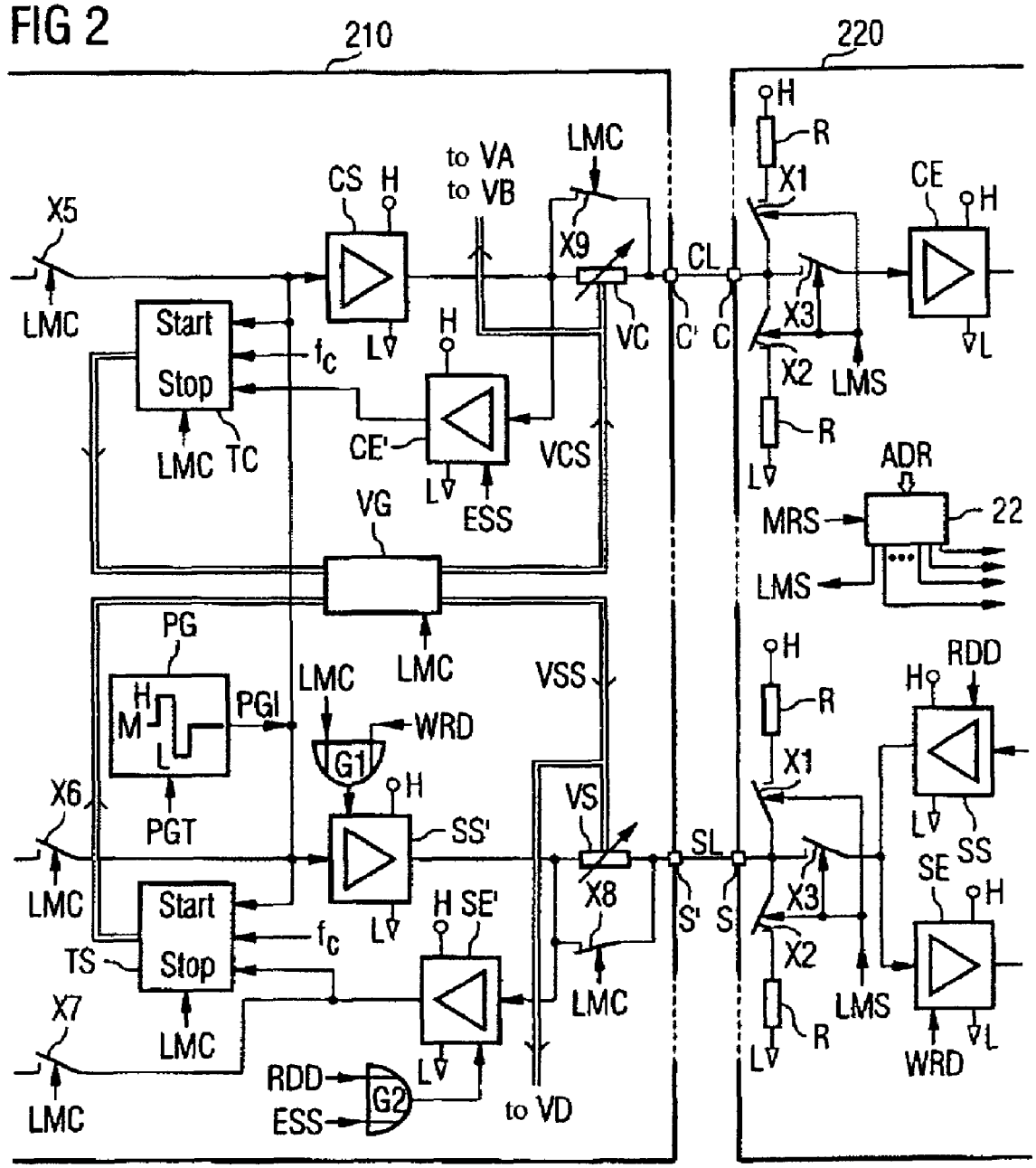
FIGS. 2, 3 and 4 show various embodiments of circuit arrangements which can be inserted in a memory system as shown in FIG. 1 in order to perform the inventive method.

FIG. 2 shows circuit means for performing an inventive adjustment method for compensating for the propagation time difference between an "A/B/C phase", on the one hand, which contains the address and instruction lines AL and BL and the clock line CL, and a "D/S" phase, on the other hand, which contains the data lines DL and the strobe line SL. The two line phases which connect a controller chip 210 to an SDRAM chip 220 are not shown in full in FIG. 2. The Figure shows only those two lines which are preferably used for ascertaining the propagation time difference between the phases, namely the clock line CL (as representative of the A/B/C phase) and the strobe line SL (as representative of the D/S phase). Of the two chips 210 and 220, only a few parts are shown in each case, specifically those which are involved in the inventive adjustment method and which are connected to the two lines CL and SL. In all other parts, these chips have exactly the same design as the controller 110 and the SDRAM 120 shown in FIG. 1 (with the exception of additional delay devices on all connections of the controller, which are not shown in FIG. 1).

The controller 210 shown in FIG. 2 contains a regulatable delay device VS between the strobe connection S' and the junction point at which the output of the strobe transmission amplifier SS' and the input of the strobe reception amplifier SE' are interconnected. A further regulatable delay device VC is inserted between the clock connection C' of the controller 210 and the output of the clock transmission amplifier CS. There are also regulatable delay devices arranged in a similar fashion at the other connection pins of the controller 210, from which connecting lines are routed to the SDRAM 220 (not shown in FIG. 1). That end of the delay device VC, which is remote from the clock connection C', also has the input of an additionally provided reception amplifier CE' connected to it. The reception amplifier is turned on only when a control signal ESS (which has yet to be described) is at the active level.

At the clock connection C and at the strobe connection S in the SDRAM 220, shown in FIG. 2, there is respectively shown the resistor network already explained above, which contains two terminating resistors R, one between the connection in question and the first supply potential H, and one between the connection in question and the second supply potential L. The resistance value of each of the resistors R is twice as large as that of the characteristic impedance $Z_0$ of the connecting line connected to the connection in question. In the SDRAM shown in FIG. 2, two switches X1 and X2 are respectively provided not just at the strobe connection S, but also at the clock connection C, in order to isolate the connection in question from the associated terminating resistors R. In addition, a respective third switch X3 is provided in order to isolate the connection in question from the input of the downstream reception amplifier CE or SE.

The remaining circuit parts, which are provided for the purpose of performing the inventive adjustment method in the arrangement shown in FIG. 2, are described below together with the adjustment method:

At the start of the adjustment method, all of the switches X1, X2, X3 are closed, which means that the lines SL and CL are terminated at the SDRAM 220 without reflection. In the controller 210, a mode setting instruction is generated which is coded in the controller in the form of a multibit instruction word and, under synchronization by the clock signal CLK, is transmitted to the SDRAM 220 via the instruction lines BL (cf. FIG. 1). If the SDRAM 220 is one of a plurality of SDRAMs of the same type which are all connected to the controller 210 as shown in the diagram shown in FIG. 1, the instruction word also contains chip selection bits for exclusively selecting only that SDRAM, which has connecting lines that are necessary to perform the propagation time adjustment. The text below deals with the situation in which the SDRAM 220 is being addressed.

In the addressed SDRAM 220, the instruction decoder 21 (cf. FIG. 1) decodes the mode setting instruction in order to generate the mode setting signal MRS. This enables the mode register 22 for the purpose of registering a pattern of setting bits which are generated together with the instruction word in the controller 210 and are transmitted to associated inputs of the mode register 22 via the address lines AL. To perform the inventive propagation time adjustment, the controller 210 sets a particular bit from the setting bits to the active logic level (e.g. to the binary value "1"), so that this bit's associated output of the mode register 22 activates a signal LMS ("propagation time adjustment mode in the SDRAM"). The active signal LMS opens the switches X1, X2, X3 at the SDRAM connections S and C, which means that the reflection-free termination of the connecting lines SL and CL of the SDRAM 220 is removed and these lines are now "open".

When this has happened, the controller is also conditioned to perform the propagation time adjustment. To this end, the controller activates an internal signal LMC ("propagation time adjustment mode in the controller"), which brings about the following:

a switch X5 is opened in order to decouple the input of the clock signal transmission amplifier CS from the source of the clock signal;

a switch X6 is opened in order to decouple the input of the strobe transmission amplifier SS' from the strobe generator STG' (cf. FIG. 1);

a switch X7 is opened in order to decouple the output of the strobe reception amplifier SE' from the associated sampling circuit FF (cf. FIG. 1);

a first and a second chronometric device TC and TS and a delay actuating signal transmitter VG are switched to the standby state (e.g. by turning on the power supply for these elements);

the strobe transmission amplifier SS' is turned on;

switches X8 and X9 are closed to bypass the regulatable delay devices VC and VS;

the strobe transmission amplifier SS' is turned on via an OR gate G1 which is connected upstream of the control input of this amplifier and whose second input receives the write mode signal WRD.

Next, the controller 210 activates a trigger signal PGT, which triggers a pulse generator PG, which then delivers a measurement pulse PGI. This pulse is preferably an AC pulse which changes from an average level M to the potential H, changes from that potential to the potential L and then returns to the average potential again, as shown in FIG. 2 on the pulse generator PG. The measurement pulse PGI is simultaneously applied to the signal inputs of the clock transmission amplifier CS and of the strobe transmission amplifier SS' and also to a "start" input of each of the two chronometric devices TC and TS. The operation of the chronometric devices TC and TS is started by the negative edge of the measurement pulse PGI (change from the H level to the L level) and is stopped by a negative edge at a "stop" input. The stop input of the chronometric device TS is connected to the output of the strobe reception amplifier SE', and the stop input of the chronometric device TC is connected to the output of the reception amplifier CE'.

The chronometric devices TC and TS may each be a counter, for example, to which counting pulses at a fixed frequency FC are applied, with the fixed frequency being the largest possible multiple of the frequency of the clock signal CLK. The negative edge of the measurement pulse PGI at the start input can set these counters to 0 so as then to count the counting pulses upward until the counting operation is stopped by a negative edge at a "stop" input.

The measurement pulse PGI generated by the pulse generator PG passes through the strobe transmission amplifier SS' and the closed switch X8 to the strobe connection S' and from there to the strobe line SL. The strobe reception amplifier SE' is still kept turned off at this time, specifically by means of the inactive level of a reception amplifier control signal ESS which is ORed with the read mode signal RDD at the control input of the amplifier SE' by a gate G2. The measurement pulse PGI also passes via the clock transmission amplifier CS and the closed switch X9 to the clock connection C' and from there to the clock line CL. The reception amplifier CE' situated at the same connection is likewise kept turned off at this time by the inactive level of the control signal ESS. The pulses transmitted to the lines SL and CL are reflected at the openly terminated ends of these lines, so that after a certain time echoes of these pulses arrive at the connections S' and C'. The echoes arrive at different times if the signal propagation times via the two lines SL and CL are different.

FIG. 2 shows two timing diagrams showing the waveforms of the pulses appearing at the connection C' (top diagram) and of the pulses appearing at the connection S' (bottom diagram) over the same time axis, specifically for the situation in which the signal propagation time via the clock line CL is longer than the signal propagation time via the strobe line SL. The waveforms are distorted relative to the waveform of the measurement pulse generated by the pulse generator PG, on account of the reactances of the lines. In addition, the echo pulses are somewhat weaker than the transmitted pulse on account of the line damping. The echo pulses have the same polarity as the transmitted pulse because the reflection at the open terminated end of a line is known to take place without polarity reversal.

In the case illustrated, a representative variable for the propagation time along a line is thus the interval of time between the negative edge of the transmitted pulse and the negative edge of the associated echo pulse. This interval of time is the same as the out/return propagation time via the line and in the case illustrated is longer by the measure Δt on the clock line CL than on the strobe line SL. To compensate for the propagation time difference between the lines CL and SL, the delay device VS thus needs to bring about a delay which is Δt/2 longer than the delay by the delay device VC.

To ascertain the appropriate delay setting values VCS and VSS for the delay devices VC and VS for this purpose, the controller 210 activates the control signal ESS directly after dispatch of the measurement pulse PGI for the rest of the duration of the active level of the signal LMC in order to turn on the reception amplifiers SE' and CE' in the controller for this period. The amplifier SE' routes the echo signal appearing at the strobe connection S' to the stop input of the chronometric device TS, so that this device is stopped and its output delivers a first chronometric value which indicates the out/return propagation time via the strobe line SL and is applied to a first input of the delay actuating signal transmitter VG. The amplifier CE' routes the echo signal appearing at the clock connection C' to the stop input of the chronometric device TC, so that this device is stopped and its output delivers a second chronometric value which indicates the out/return propagation time via the clock line CL and is applied to a second input of the delay actuating signal transmitter VG. The delay actuating signal transmitter VG ascertains the difference Δt from the two chronometric values and generates the appropriate setting values, VSS and VCS, in order to set the delay devices VS and VC such that VS produces a delay which is the measure Δt/2 longer than that produced by VC.

The setting value VCS, which sets the delay on the clock line CL, is also used to set the delays on all the other connecting lines which are in the same phase as the clock line to the same value. In the example being dealt with here, these are the address lines AL and the instruction lines BL (not shown in FIG. 2). Accordingly, the setting value VCS is also transmitted to the delay devices VA on the address pins A' and to the delay devices VB on the instruction pins B' (likewise not shown in FIG. 2).

Similarly, the setting value VSS, which sets the delay on the strobe line SL, is also used to set the delays on all the other connecting lines which are in the same phase as the strobe line to the same value. In the example being dealt with here, these are the data lines DL (not shown in FIG. 2). Accordingly, the setting value VSS is also transmitted to the delay devices VD on the data pins A' (likewise not shown in FIG. 2).

When the delay devices have been set, the adjustment operation can be terminated by virtue of the controller 210, deactivating the signal LMC. This closes the switches X5 to X7 in the controller again, the bypass switches X8 and X9 are opened and the chronometric devices TC, TS, the pulse generator PG and the delay actuating signal transmitter VG are switched to "dead". The delay devices remain fixed at the set values for the future. Next, the controller 210 uses the address and instruction connections to transmit any new mode setting instruction code in which the bit reserved for performing the inventive propagation time adjustment is at the inactive logic level (e.g. at the binary value "0"), so that the signal LMS is deactivated in the SDRAM 120. This opens the switches X1, X2, X3 on the SDRAM connections S and C again, so that the connecting lines SL and CL are again terminated at the SDRAM 220 without reflection.

This last operation "calibrates" the communication link between the controller 210 and the SDRAM 220. In all subsequent operations of the memory system, the transmitted signals generated by the controller 210, that is to say address bits ADR, instruction bits BEF, the clock signal CLK, the strobe signal STR' and data bits DAT have the same propagation time via the delay devices and connecting lines to the SDRAM 220.

Figure 3:
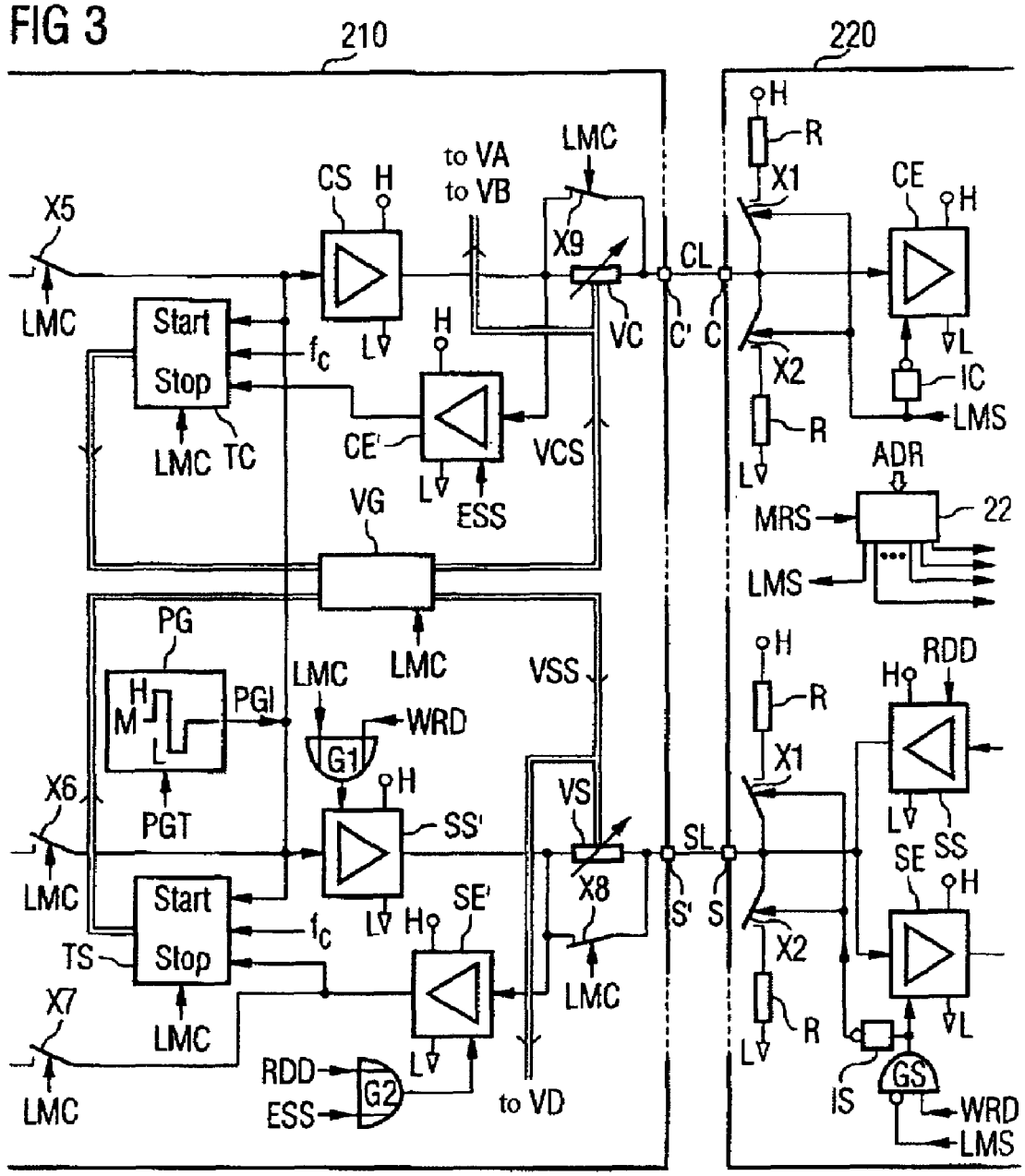
Figure 3:
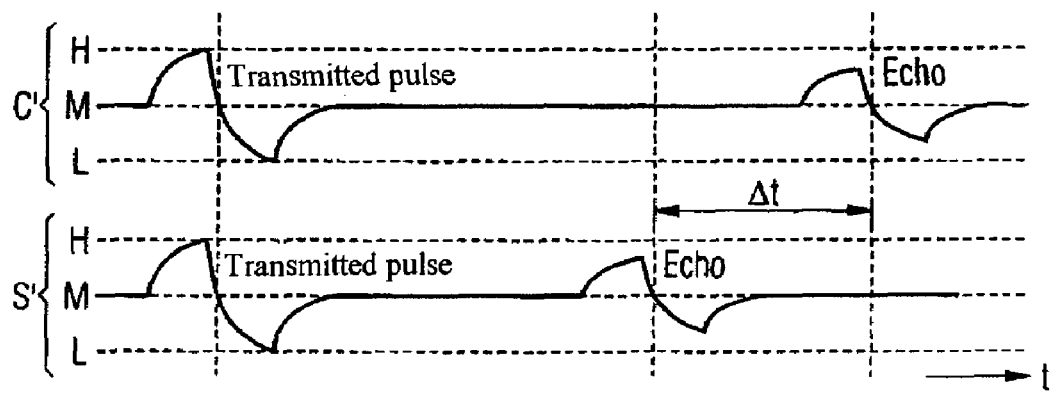

The switching device shown in FIG. 2 in the SDRAM 220 for converting the reflection-free termination into an open termination is just one exemplary embodiment. FIG. 3 shows a variant in which the switches X3 are omitted and instead measures are taken to disconnect the reception amplifiers CE and SE connected to the connections C and S when the signal LMS is active. To this end, an AND gate GS is provided at the control input of the strobe reception amplifier SE and logically combines the write mode signal WRD with the inverted version of the signal LMS. The effect of this is that the amplifier SE is on only when LMS is inactive and the write mode signal WRD is activated. The opening of the switches X1 and X2 at the connection S is controlled by the output of the AND gate GS via an inverter IS, so that these switches are open not just when the signal LMS is active but rather also when in the normal mode of the SDRAM 220 a read operation (that is to say not a write operation) is running in which the strobe transmission amplifier SS of the SDRAM transmits a strobe signal to the controller 210. The clock reception amplifier CE is in the form of an amplifier which can be turned on and off in the variant shown in FIG. 3, and its control input has the signal LMS applied to it via an inverter IC. In the variant shown in FIG. 3, the controller 210 is designed in exactly the same way and operates in the same manner as has been described with reference to FIG. 2.

Figure 4:
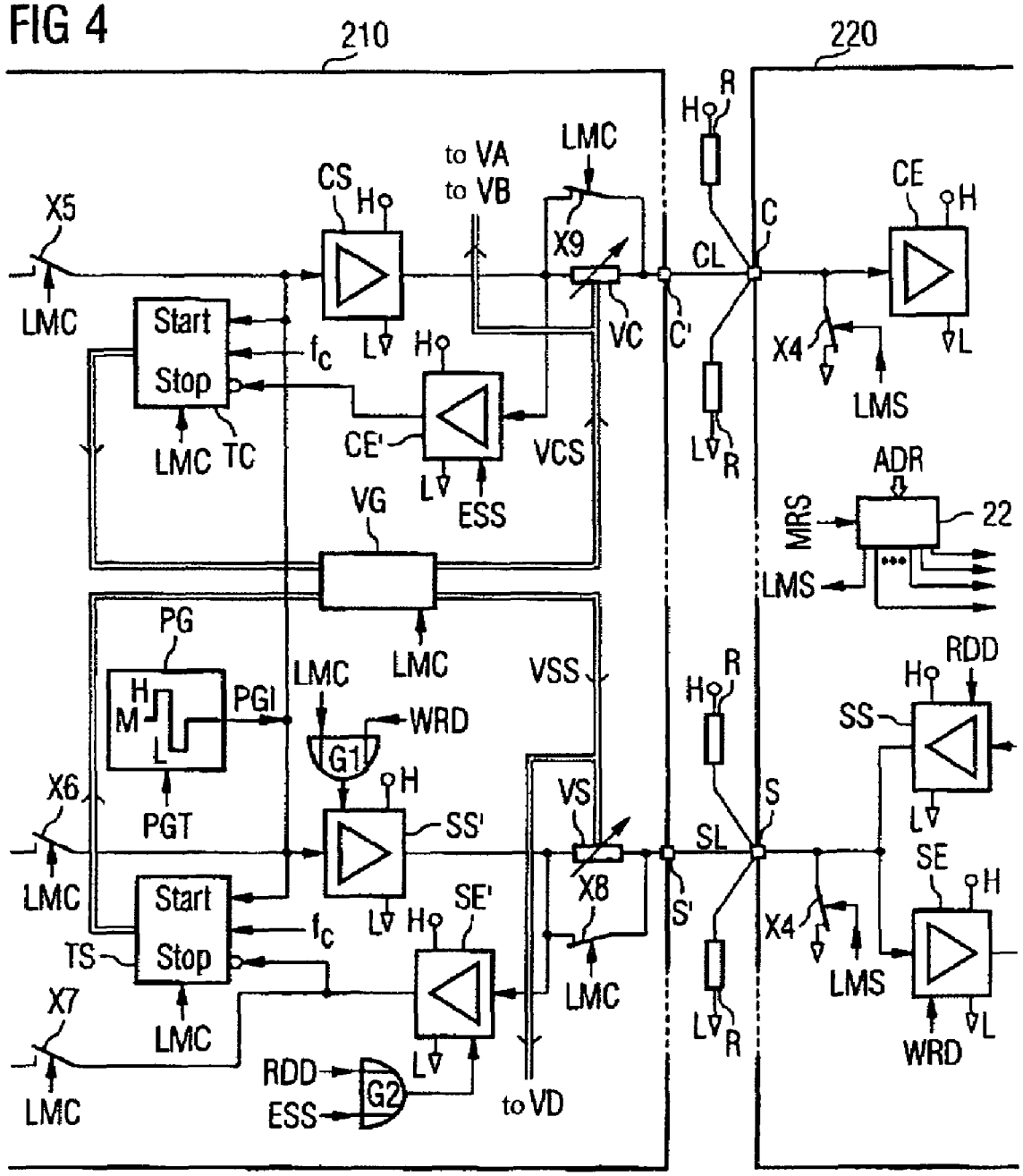
Figure 4:
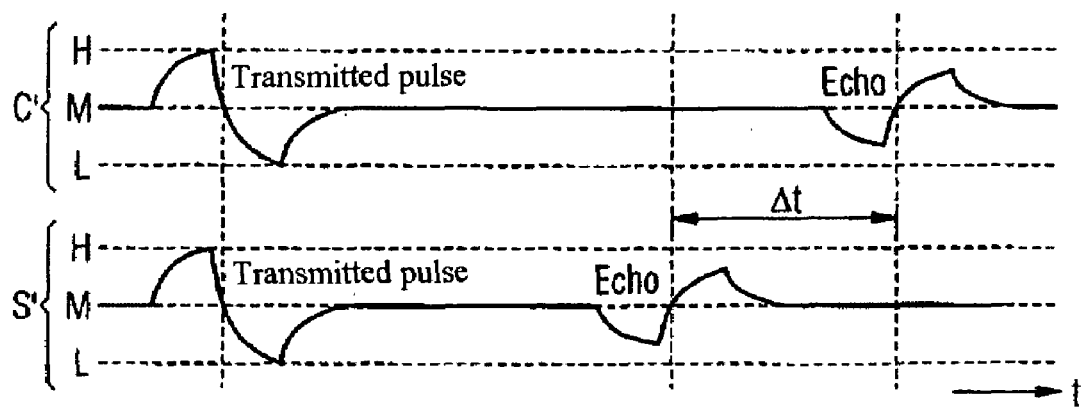

In the two embodiments shown in FIGS. 2 and 3, the desired reflection of the measurement pulse is achieved through open termination of the connecting lines CL and SL. As an alternative, the reflection can also be achieved through short circuit termination. This alternative is recommended particularly when the terminating resistors R at the connections of the SDRAM are arranged outside of the chip and are connected to the supply potentials H and L, specifically through solid soldering on the board which carries the chips, as shown in FIG. 4. In this case, it is not possible to detach these resistors from the connections temporarily in order to achieve an open termination.

To attain a short circuit termination with a sufficiently high level of reflection, it suffices to connect the relevant connections of the connecting lines on the SDRAM to one of the supply potentials H or L at low resistance. As FIG. 4 shows, this is done by providing a normally open shunt switch X4 between each of the connections C and S of the SDRAM 220 and the L potential, with the normally open switch being closed via the active level of the signal LMS. This signal LMS is kept active only during the inventive adjustment operation, exactly as was described with reference to FIG. 2. In the embodiment shown in FIG. 4, the controller 210 is designed in exactly the same way and operates in the same manner as has been described with reference to FIG. 2, apart from a small difference involving the chronometric devices TC and TS being stopped by the appearance of a positive edge at the stop inputs (instead of by a negative edge as in the situations in FIGS. 2 and 3). This is indicated in FIG. 4 by a symbol in the form of a small circle at said stop inputs and is necessary because a polarity reversal is known to take place upon a reflection at a shorted line end. The negative edge of the transmitted measurement pulse therefore appears as a positive edge in the echoes, as shown in the timing diagrams in FIG. 4.

The above embodiments described with reference to FIGS. 2 to 4 are just examples and can be modified or expanded in various ways. Some of these modifications and expansions are described below.

Instead of the clock line CL and the strobe line SL, any other line in the line phase in question may respectively be used for the comparative propagation time measurement, e.g. one of the lines in the address line bundle AL or in the instruction line bundle BL as a representative of the A/B/C phase and one of the lines in the data line bundle as a representative of the S/D phase.

It is also possible for all lines of that phase which is known to have the longest propagation time to be provided with no delay devices at all. In this case, the delay actuating signal transmitter needs to generate just one setting value for regulatable delay devices on the lines in the other phase.

On the other hand, it is also possible for the delay devices for all of the lines in a first phase to be given fixed proportions and for only the delay devices for the other lines to be made regulatable. In this case, too, the delay actuating signal transmitter needs to generate just one setting value for the other delay devices. This variant is recommended in a "multiple" memory system in which the controller in the diagram shown in FIG. 1 is connected to a plurality of memory chips.

To adjust the signal propagation times in such a "multiple" memory system, a separate adjustment operation needs to be performed for each memory chip. In this context, the delay devices at the A/B/C connections A', B, C' of the controller need to remain at a fixed value because these connections are connected in parallel to all of the memory chips. When the adjustment operation has been performed and ended in connection with a first memory chip in the manner described above (and hence all signals which are transmitted between the controller and this first chip are of the same propagation time), the operation is repeated in the same way, but with the selection of the next chip by means of appropriate coding of the chip selection bits on the instruction connections of the controller. In this adjustment operation, the delay devices VS and VD at the strobe connection S' and at the data connections of this chip are automatically set such that when the adjustment operation has ended, all signals which are transmitted between the controller and this chip are of the same propagation time. In the same way, the propagation time adjustment can be performed for all further memory chips in the multiple memory system.

In the case of the method described above, delay devices at the A/B/C connections can be omitted completely if the A/B/C line phase from the controller to the "furthest" memory chip is shorter than the D/S line phase to the "closest" memory chip.

A prerequisite of the exemplary embodiments described above is that the group comprising the address, instruction and clock lines AL, BL, CL and the group comprising the strobe and data lines SL, DL each form a "phase", within which there are no significant propagation time differences. In practice, the division into such phases may also be different, however. Hence, particularly at very high clock frequencies, a situation may arise in which it is necessary to compensate for, by way of example, propagation time differences between the strobe line SL and the data line bundle DL or even propagation time differences between individual lines in the DL bundle, or, by way of example, propagation time differences between the address, instruction and clock lines AL, BL, CL. In such cases, there are more than two "phases" in the sense defined above, with one or more phases even being able to comprise just a single line. It is then appropriate to select one of the phases as a reference phase and to ascertain the propagation time differences between this reference phase and the other phases using echo measurements in order to set regulatable delay devices on each of the other phases in an appropriate fashion.

The measurement pulse used for generating the echo may also have a different waveform than the one shown in FIGS. 2 to 4; the only condition is that the pulse has an explicitly detectable edge whose echo is likewise explicitly detectable. Even a simple pulse swinging only in a negative (or only in a positive) direction may be suitable, particularly when using a short circuit termination using a shunt switch routed to the L potential (or to the H potential), as shown in FIG. 4. Gaussian or sinusoidal pulse shapes may also be used.

In the propagation time measurement at a bidirectional connection (such as at the strobe connection S'), it is possible to use the reception amplifier provided for this line in order to receive the echo, as shown in FIGS. 2 to 4. Alternatively, it is possible to provide a separate amplifier or edge detector for echo reception which is turned on directly by the control signal ESS, in a similar manner to that shown in FIGS. 2 to 4 for the echo reception at the clock connection C'.

The propagation time measurements and the setting of the delays may also take place on the memory chip end. To this end, the measurement pulse generator, the chronometric devices and the delay devices that are to be set would need to be provided in the memory chip and the switching devices for the reflective line termination would need to be provided in the controller.

Finally, it should also be mentioned that the switches, which are shown using the usual switch symbols in the figures, are naturally formed by controllable semiconductor elements, e.g. by field-effect transistors.

While the foregoing is directed to embodiments of the present invention, other and further embodiments of the invention may be devised without departing from the basic scope thereof, and the scope thereof is determined by the claims that follow.

What is claimed is:

1. A method for adjusting signal propagation times in a system in which connections of a controller are connected to connections of at least one memory chip via a plurality of connecting lines for the purpose of transmitting control and data signals and at least one time reference signal, comprising:
   i) changing an input impedance at a respective connection of at least two connecting lines into a reflective termination for the connecting lines in question;
   ii) ascertaining propagation time differences between the connecting lines from a result of echo measurements in which a respective transmitted pulse is applied to the connection of the connecting lines which has not had its input impedance changed into the reflective termination and an echo time which elapses between an edge of the transmitted pulse and an appearance of the echo of this edge reflected from the other end is measured; and
   iii) setting delay devices associated with the connecting lines on the basis of the ascertained propagation time differences in order to compensate for the propagation time differences.

2. The method of claim 1, where the connection on the controller is selected as the connection line connection which has not had its input impedance changed into the reflective termination.

3. The method of claim 2, wherein the ascertained propagation time differences are compensated for by setting regulatable delay devices in the controller.

4. The method of claim 1, wherein the reflective termination of the connecting lines is produced by an open circuit.

5. The method of claim 1, wherein the reflective termination of the connecting lines is produced by a short circuit.

6. The method of claim 2,
wherein the controller is connected to m>1 memory chips, each memory chip having a first group of connections which are connected to a first connection group of the controller via connecting lines; and
wherein the controller has m further connection groups, each of which is connected to a second connection group of an individually associated memory chip via connecting lines, wherein delays on signal paths in the controller which run via the first connection group of the controller are permanently set and the succession of steps i), ii) and iii) performed separately for each memory chip while maintaining this permanent setting.

7. A circuit arrangement for adjusting signal propagation times in a system in which connections of a controller are connected to connections of at least one memory chip via a plurality of connecting lines for the purpose of transmitting control and data signals and at least one time reference signal, comprising:
logic configured to change an input impedance at a respective connection of at least two connecting lines into a reflective termination for the connecting lines in question;
logic to ascertain propagation time differences between the connecting lines from a result of echo measurements in which a respective transmitted pulse is applied to the connection of the connecting lines which has not had its input impedance changed into the reflective termination and an echo time which elapses between an edge of the transmitted pulse and appearance of the echo of this edge reflected from the other end is measured; and
logic for setting delay devices associated with the connecting lines on the basis of the ascertained propagation time differences in order to compensate for the propagation time differences.

8. The circuit arrangement of claim 7, further comprising:
external connections designed for receiving control and data signals via connecting lines from a controller and which each have a matching resistor network for matching the input impedance to a characteristic impedance of the connecting line which is to be connected; and
wherein selected connections have a respective associated changeover device which responds to an adjustment mode signal in order to change the input impedance at the connection in question into a reflective termination for the connecting line in question.

9. The circuit arrangement of claim 7, where the reflective termination is an open circuit.

10. The circuit arrangement of claim 7, where the reflective termination is a short circuit termination.

11. The circuit arrangement of claim 8, wherein the selected connections each comprise a single connection from each connection group which are associated with a respective group of connecting lines with a negligible propagation time difference.

12. The circuit arrangement of claim 7, further comprising:
external connections for transmitting control signals and for transmitting and receiving further signals via external connecting lines for communication with at least one memory chip;
regulatable delay devices for delaying the signals traveling through the external connections on the basis of associated actuating signals, a measurement pulse generator, which can be activated by an adjustment mode signal, for applying a measurement pulse edge to selected connections;
for each of the selected connections, a respective reception circuit responsive to the adjustment mode signal in order to detect an echo of the measurement pulse edge as it appears at the transmission connection in question after said edge;
chronometric means for measuring a time interval between an application of the measurement pulse edge and the detection of the echo at each of the selected connections; and
an actuating signal generation device which generates the actuating signals for the regulatable delay devices as a function of the measured time intervals such that propagation time differences between the external connecting lines are compensated for.

13. The circuit arrangement of claim 12, wherein selected connections each comprise just one connection from each connection group, which are associated with a respective group of connecting lines with a negligible propagation time difference.

14. A system, comprising:
one or more memory devices; and
a memory controller having a circuit arrangement for adjusting signal propagation times in a memory system in which connections of a controller are connected to connections of at least one memory chip via a plurality of connecting lines for the purpose of transmitting control and data signals and at least one time reference signal, the circuit arrangement comprising:
logic configured to change an input impedance at a respective connection of at least two connecting lines into a reflective termination for the connecting lines in question;
logic to ascertain propagation time differences between the connecting lines from the result of echo measurements in which a respective transmitted pulse is applied to the connection of the connecting lines which has not had its input impedance changed into the reflective termination and an echo time which elapses between an edge of the transmitted pulse and an appearance of the echo of this edge reflected from the other end is measured; and
logic for setting delay devices associated with the connecting lines on the basis of the ascertained propagation time differences in order to compensate for the propagation time differences.

15. The system of claim 14, wherein the circuit arrangement further comprises:
external connections designed for receiving control and data signals via connecting lines from a controller and which each have a matching resistor network for matching the input impedance to a characteristic impedance of the connecting line which is to be connected; and
wherein selected connections have a respective associated changeover device which responds to an adjustment mode signal in order to change the input impedance at the connection in question into a reflective termination for the connecting line in question.

16. The system of claim 14, wherein the reflective termination is an open circuit.

17. The system of claim 14, where the reflective termination is a short circuit termination.

18. The system of claim 15, wherein the selected connections each comprise a single connection from each connection group which are associated with a respective group of connecting lines with a negligible propagation time difference.

19. The system of claim 18, further comprising:
external connections for transmitting control signals and for transmitting and receiving further signals via external connecting lines for communication with at least one memory chip;
regulatable delay devices for delaying the signals traveling through the external connections on the basis of associated actuating signals, a measurement pulse generator, which can be activated by an adjustment mode signal, for applying a measurement pulse edge to selected connections;
for each of the selected connections a respective reception circuit responsive to the adjustment mode signal in order to detect an echo of the measurement pulse edge as it appears at the transmission connection in question after said edge;
chronometric means for measuring a time interval between an application of the measurement pulse edge and the detection of the echo at each of the selected connections; and
an actuating signal generation device which generates the actuating signals for the regulatable delay devices as a function of the measured time intervals such that propagation time differences between the external connecting lines are compensated for.

20. The system of claim 19, wherein selected connections each comprise just one connection from each connection group, which are associated with a respective group of connecting lines with a negligible propagation time difference.

* * * * *

UNITED STATES PATENT AND TRADEMARK OFFICE
CERTIFICATE OF CORRECTION

PATENT NO. : 7,573,741 B2
APPLICATION NO. : 11/236970
DATED : August 11, 2009
INVENTOR(S) : Andreas Jakobs et al.

Page 1 of 1

It is certified that error appears in the above-identified patent and that said Letters Patent is hereby corrected as shown below:

Claim 6, at Column 13, Line 12, please insert --are-- before "performed"

Claim 7, at Column 13, Line 30, please insert --an-- before "appearance"

Signed and Sealed this

Thirteenth Day of October, 2009

David J. Kappos
*Director of the United States Patent and Trademark Office*